(12) United States Patent
Elkin

(10) Patent No.: US 7,164,302 B1
(45) Date of Patent: Jan. 16, 2007

(54) ONE GATE DELAY OUTPUT NOISE INSENSITIVE LATCH

(75) Inventor: Ilyas Elkin, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/874,041

(22) Filed: Jun. 21, 2004

(51) Int. Cl.
  *H03K 3/356* (2006.01)
  *H03K 3/286* (2006.01)
(52) U.S. Cl. .................. 327/208; 327/208; 327/218
(58) Field of Classification Search ............ None
  See application file for complete search history.

(56) References Cited

U.S. PATENT DOCUMENTS

| | | | | |
|---|---|---|---|---|
| 4,495,629 A | * | 1/1985 | Zasio et al. | 377/70 |
| 5,311,070 A | * | 5/1994 | Dooley | 327/208 |
| 6,097,230 A | * | 8/2000 | Bareither | 327/202 |
| 6,348,824 B1 | * | 2/2002 | Grondalski et al. | 327/201 |
| 6,433,601 B1 | * | 8/2002 | Ganesan | 327/202 |
| 6,690,205 B1 | * | 2/2004 | Alvandpour | 326/98 |
| 2004/0080351 A1 | * | 4/2004 | Hirata et al. | 327/218 |
| 2005/0110522 A1 | * | 5/2005 | Hoekstra | 326/95 |

* cited by examiner

*Primary Examiner*—Tuan T. Lam
(74) *Attorney, Agent, or Firm*—Gunnison, McKay & Hodgson, L.L.P.; Forrest Gunnison

(57) ABSTRACT

A one gate delay output noise insensitive latch includes an input node, an output node, a storage node, a not storage node, and a data clock line. A primary latch element is connected to the input node, the output node, and the data clock line. A mirror primary latch element is connected to the input node in parallel with the primary latch element, to the storage node, and to the data clock line. A weak keeper is connected to the storage node and to the not storage node. A strong enabled tri-state keeper is connected to the not storage node, to the data clock line, and to the output node. The input node is either a dynamic data input node or a static data input node. Optionally, the weak keeper is also clock enabled.

8 Claims, 15 Drawing Sheets

OUTPUT NOISE INSENSITIVE STATICIZER LATCH 200A

KEY TO FIG. 8

| FIG. 8A |
|---|
| FIG. 8B |

ONE GATE DELAY OUTPUT NOISE INSENSITIVE LATCH

BACKGROUND OF THE INVENTION

1. Field of the Invention

The present invention relates generally to latches used in computer related circuitry, and more particularly to solutions for noise problems on latch output lines.

2. Description of Related Art

Fine-grain pipelining of dynamic data paths with delayed clocks requires that each dynamic gate acts as a storage element that holds the data until the next stage is finished evaluating. At the same time, the dynamic gate must be able to precharge and evaluate in the short cycle time provided.

The two demands placed on the dynamic gates often conflict. For example, when using domino logic, the demand that the output signal be held until the next stage evaluates requires that precharge on the dynamic gate be delayed so that the high output signal does not go low before the next stage dynamic gate is done discharging. This places a requirement that either the next stage must evaluate fast to reduce the hold time on its input, or that the current stage must wait to precharge, to meet the next stage input hold time requirement.

Both approaches add significant design costs. Delaying precharge on a dynamic gate means that it has less time to precharge, requiring larger precharge transistors to meet cycle time. Reducing hold time on the input of a dynamic gate requires that the dynamic gate be able to evaluate faster, requiring that either the pulldown stack be sized up, or a less complex gate be used.

Additionally, since complex gates have a higher delay time from the rising clock signal to domino output signal, a dynamic gate needs to wait until its evaluation is finished, plus hold the output long enough to make sure that next stage evaluation goes through, before the dynamic gate goes back into precharge. This restricts the use of complex gates with regular pipelined domino, and could potentially increase latency, since some low latency dynamic designs require that complex gates be used.

A possible solution is using a staticizer latch instead of an inverter as the static stage of the domino gate. For example, current semi-dynamic flip flop implementations such as a hybrid latch flip-flop 100 (FIG. 1A) or a semi-dynamic flip-flop 150 (FIG. 1B) use a dynamic pulldown stack followed in series by a staticizer latch 101 and 151, respectively, which drives storage element 102, 152, respectively, followed in series with an output driver (inverter) 103, 153, respectively. These configurations provided a three gate delay worst case clock-to-output terminal delay when the input signal was a high level, e.g., one, and the output signal transitioned from a high level to a low level, e.g., transitions from a one to a zero.

The burden of holding the output signal was placed on staticizer 101, 151, so that the dynamic stage could start precharging as soon as the dynamic stage was done evaluating and the output signal propagated through staticizer 101, 151. This removed the constraint of having to wait for the next stage to evaluate before the current stage could go into precharge.

However, the output signal from staticizer 101, 151 was now dynamic and floating during precharge. This required that a keeper 102, 152 be provided on the staticizer output node to hold the state during precharge. Keeper 102, 152 could be disabled during transitions so that staticizer 101, 151 did not have to fight keeper 102, 152 during evaluation. However, if inverters 103, 153 were eliminated to remove a gate delay, noise on the output line also could potentially propagate through keeper 101, 151 and flip the state of the output signal. Thus, inverters 103 and 153 were needed for noise immunity.

SUMMARY OF THE INVENTION

In one embodiment of the present invention, a one gate delay output noise insensitive latch includes an input node, an output node, a storage node, a not storage node, and a data clock line. A primary latch element is connected to the input node, the output node, and the data clock line. A mirror primary latch element is connected to the input node in parallel with the primary latch element, to the storage node, and to the data clock line. A weak keeper is connected to the storage node and to the not storage node. A strong enabled tri-state keeper is connected to the not storage node, to the data clock line, and to the output node.

In one embodiment of this latch, the input node is a dynamic data input node, and in another embodiment, the input node is a static data input node. In the first embodiment, the primary latch element is a staticizer circuit, while in the second embodiment, the primary logic element is a static logic element. In still yet another embodiment, the weak keeper is connected to the data clock line and so is a controlled keeper.

In these embodiments, the output terminal of the latch is strongly driven at all times, even when a dynamic logic stage connected to the input terminal is in precharge, meaning the output signal on the output terminal is never floating dynamic, and is always static. The storage node is separate from the output terminal thereby guaranteeing that noise on the output terminal does not switch the state of the latch, and that the output signal is returned to the correct value.

Additionally, the latch, in one of these embodiment, provides both the output terminal and the storage node with controlled keepers that are enabled during precharge, and disabled during evaluate to allow transition without having to overdrive the keepers.

In still another embodiment, a second structure includes a dynamic data input terminal, a storage node, a not storage node, an output terminal and a data clock line. A staticizer is connected to the input node, the output node, and the data clock line. A mirror staticizer is connected to the input node in parallel with the staticizer, to the storage node, and to the data clock line. A weak keeper is connected to the storage node and to the not storage node. A strong enabled tri-state keeper is connected to the not storage node, to the data clock line, and to the output node.

In one embodiment of the second structure, the weak keeper is connected to the data clock line and in another embodiment the weak keeper comprises a weak feedback inverter keeper. In one embodiment, the second structure is included in a semi-dynamic flip-flop, and in another embodiment includes a coupling to a scan chain.

In one embodiment of the second structure, the strong enabled tri-state keeper includes a transistor of a first type that in turn includes a first lead couplable to and decouplable from a first power supply voltage; a second lead connected to the output terminal; and a third lead connected to the data clock line.

The strong enabled tri-state keeper also includes a transistor of a second type that in turn includes a first lead connected to the output terminal, a second lead couplable to and de-couplable from a second power supply voltage; and a third lead connected to the not storage node.

The strong enabled tri-state keeper further includes another transistor of the first type that in turn includes a first lead connected to the first power supply voltage; a second lead connected to the first lead of the transistor of the first type; and a third lead connected to the not storage node. In one embodiment, the another transistor is shared with the weak keeper.

In one embodiment of the second structure, the staticizer includes a transistor of a first type that in turn includes a first lead connected to a first power supply voltage; a second lead connected to the output terminal; and a third lead connected to the dynamic data input terminal.

The staticizer further includes a transistor of a second type. The transistor of the second type in turn includes a first lead connected to the output terminal; a second lead couplable to and de-couplable from a second power supply voltage; and a third lead connected to the data clock line.

The staticizer further includes another transistor of the second type. The another transistor of the second type in turn includes a first lead connected to the second power supply voltage; a second lead connected to the second lead of the transistor of the second type; and a third lead connected to the dynamic data input terminal. In one embodiment, the another transistor is shared with the mirror staticizer.

In another embodiment, a third structure includes means for passing an input signal to an output node upon a clock signal being asserted in a clock cycle. The third structure also includes means for storing the input signal in a storage node upon the clock signal being asserted to obtain a stored signal. The storage node is isolated from the output node. The storage node also is in parallel with the output node. The third structure further includes means for driving the stored signal on the output node upon the clock signal being de-asserted in the clock cycle.

Each of the above embodiments, or any combination of the above embodiments may be included in a system. The embodiments may be included in a common circuit within the system, as well as in different circuits within the system. The system can be a single integrated circuit or more complex system that includes a plurality of integrated circuits.

Figure 1A:
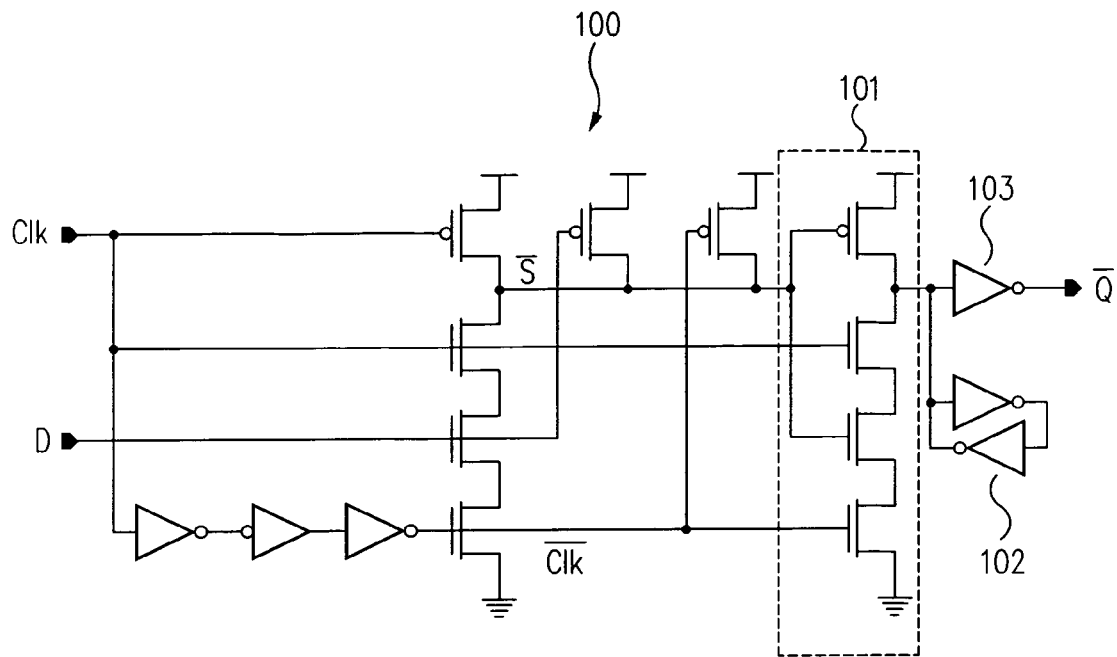
FIG. 1A is an illustration of a prior art hybrid latch-flip-flop.
Figure 1B:
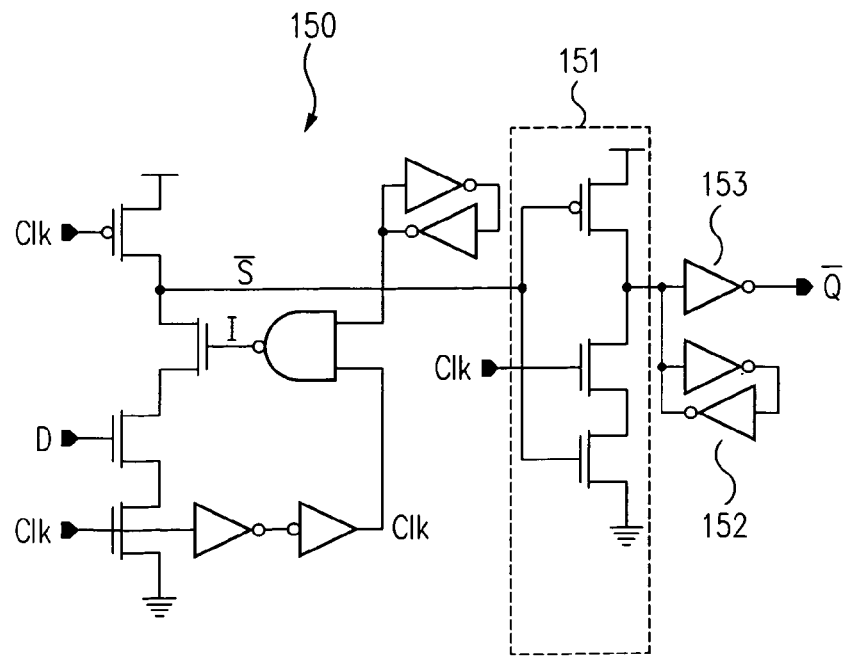
FIG. 1B is an illustration of a prior art semi-dynamic flip-flop.

In the drawings and the detailed description, elements with the same reference numeral are the same or equivalent elements. Also, for three digit reference numerals, the first digit of the reference numeral is the figure number in which the corresponding element first appears. For four digit reference numerals, the first two digits of the reference numeral are the figure number in which the corresponding element first appears. A reference numeral with the same set of characters is the same reference numeral irrespective of the case of the characters. Thus, the use of uppercase and lowercase in two reference numerals with the same set of characters except for the case of the characters is not intended to denote two different reference numerals.

DETAILED DESCRIPTION

Figure 2:
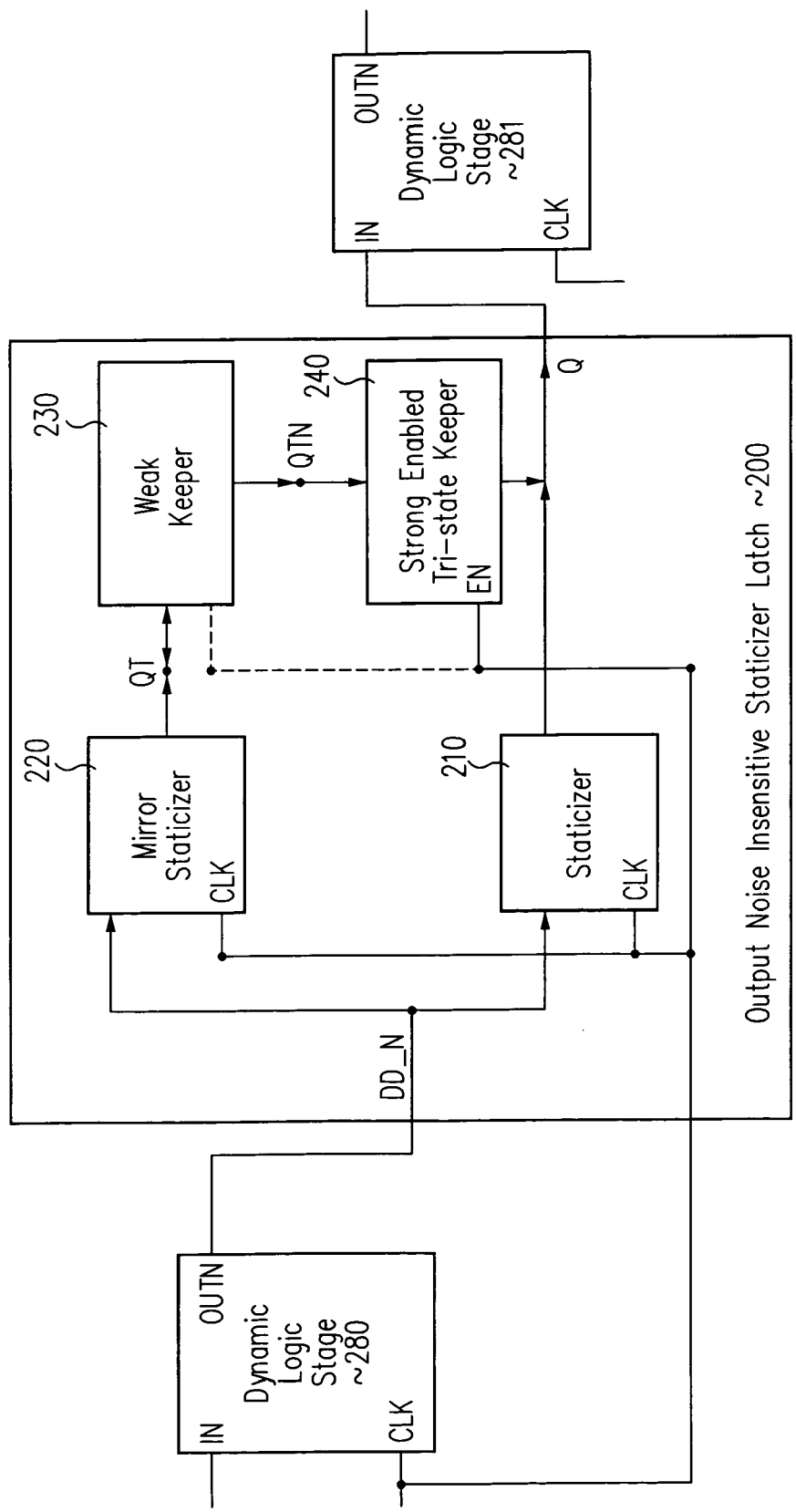
FIG. 2 is a high-level block diagram of a circuit that includes an output noise staticizer latch, according to one embodiment of the present invention.

FIG. 2 is a block diagram of one embodiment of an output noise insensitive staticizer latch 200. Latch 200 has a dynamic data input terminal DD_N and an output node Q. In response to an input signal an output signal is driven on output node Q, and in parallel a signal having the same signal level as the output signal is written in a storage node QT.

Latch 200 is output noise insensitive while eliminating the one-inverter delay in the output path of the prior art configuration. Latch 200 provides a non-inverting output signal for the signal on terminal IN of dynamic logic stage 280. Latch 200 also has only a one-gate delay for an asserted signal to a de-asserted signal clock-to-output terminal delay and a two-gate delay for a de-asserted signal to an asserted signal clock-to-output terminal delay.

Various embodiments of an output noise insensitive latch are described below. Also, described are embodiments including a semi-dynamic edge triggered flip-flop that uses various embodiments of the output noise insensitive latch.

In the embodiment of FIG. 2, a dynamic logic stage 280 provides a dynamic input signal from an input terminal IN to dynamic data input terminal DD_N of latch 200. An output terminal Q of latch 200 drives an input terminal IN of another dynamic logic stage 281.

An input line of staticizer 210 of latch 200 and an input line of mirror staticizer 220 of latch are connected, in parallel, to dynamic data input terminal DD_N. An output line of staticizer 210 is connected to output terminal Q. An output line of mirror staticizer 220 is connected to storage node QT.

An input terminal of a weak keeper 230 is connected to storage node QT. A not storage node terminal of weak keeper 230 is connected to not storage node QTN, and an output terminal of weak keeper 230 is connected to storage node QT.

Strong enabled tri-state keeper 240 has an input terminal connected to not storage node QTN and an output terminal connected to output node Q. Data clock line CLK is connected to staticizer 210, mirror staticizer 220, strong enabled tri-state keeper 240 and optionally to weak keeper 230.

When the signal on data clock line CLK, sometimes called clock line CLK, or line CLK, is asserted, staticizer 210 drives a signal output terminal Q, and mirror staticizer 220 drives a signal storage node QT, in response to a signal on terminal DD_N. When the signal on data clock line CLK is de-asserted, weak keeper 230 maintains the signal level, i.e., state, of storage node QT and drives the complement of storage node QT signal on not storage node QTN.

When the signal on data clock line CLK is de-asserted, strong enabled tri-state keeper 240 is enabled and maintains the state of the signal on output terminal Q. Specifically, keeper 240 drives the complement of the signal on not storage node QTN on output terminal Q.

Since storage node QT is isolated from output terminal Q, noise on the output line connected to node Q cannot change the state of either keeper 230 or 240. Accordingly, latch 200 is insensitive to noise on the output line. Also, since no additional elements are inserted between primary staticizer 210 and output terminal Q, no additional output signal delay is incurred in providing the output noise insensitivity.

Output terminal Q of latch 200 is strongly driven at all times, even when dynamic logic stage 280 is in precharge, meaning the output signal on terminal Q is never floating dynamic, and is always static. Storage node QT is separate from output terminal Q thereby guaranteeing that noise on output terminal Q does not switch the state of latch 200, and that the output signal is returned to the correct value.

Additionally, latch 200, in one embodiment, provides both output terminal Q and storage node QT with controlled keepers that are enabled during precharge, and disabled during evaluate to allow transition without having to overdrive the keepers.

Enabled keeper 240 on output terminal Q, in this embodiment, is enabled by a de-asserted signal on data clock line CLK. However, as explained more completely below, weak keeper 230 can be either an enabled keeper for storage node QT, or a cross-coupled inverter, for example. In one embodiment, weak keeper 230 is enable controlled for faster operation. In another embodiment, which is described more completely below, sharing of some transistors with output enabled keeper 240 means that no additional gates are required to have a controlled storage element keeper 230.

Latch 200 includes a staticizer 210 with controlled large keeper 240 that makes latch 200 fully static at all times and constantly driven by either staticizer 210, keeper 240 or both. Additionally, while keeper 240 is providing static output drive during precharge, keeper 240 is controlled, and turned off during transitions, when staticizer 210 is driving output terminal Q. This eliminates the unnecessary crowbar current present in cross-coupled inverter keepers.

Most importantly, storage node QT is not coincident with output terminal Q, but a separate copy of output terminal Q with no feedback path from output terminal Q to storage node QT. This makes it almost impossible (aside from capacitive coupling to the storage element which can be prevented by proper shielding) for noise on output terminal Q to flip the state of latch 200. In this embodiment, latch 200 is a new one gate delay staticizer latch that provides uninterrupted static drive to output terminal Q while maintaining the latch state in a copy of output node Q, i.e., storage node QT that is decoupled from the output noise.

An improved semi-dynamic flip-flop based on semi-dynamic latch 200 is also described more completely below. The improved semi-dynamic flip-flop provides an improvement in worst-case propagation delay from three to two gate delays over semi-dynamic flip-flop 150, and a best-case propagation delay from two to one gate delay, similar to semi-dynamic latch 200. Additionally, the improved semi-dynamic flip-flop is non-inverting, with a fast asserted to de-asserted transition.

Scannable versions of both the improved semi-dynamic flip-flop and the semi-dynamic latch are also introduced, with no additional load on either the clock, the dynamic stage or the output driver. The scan circuitry overhead is taken completely out of the data critical path.

Figure 3:
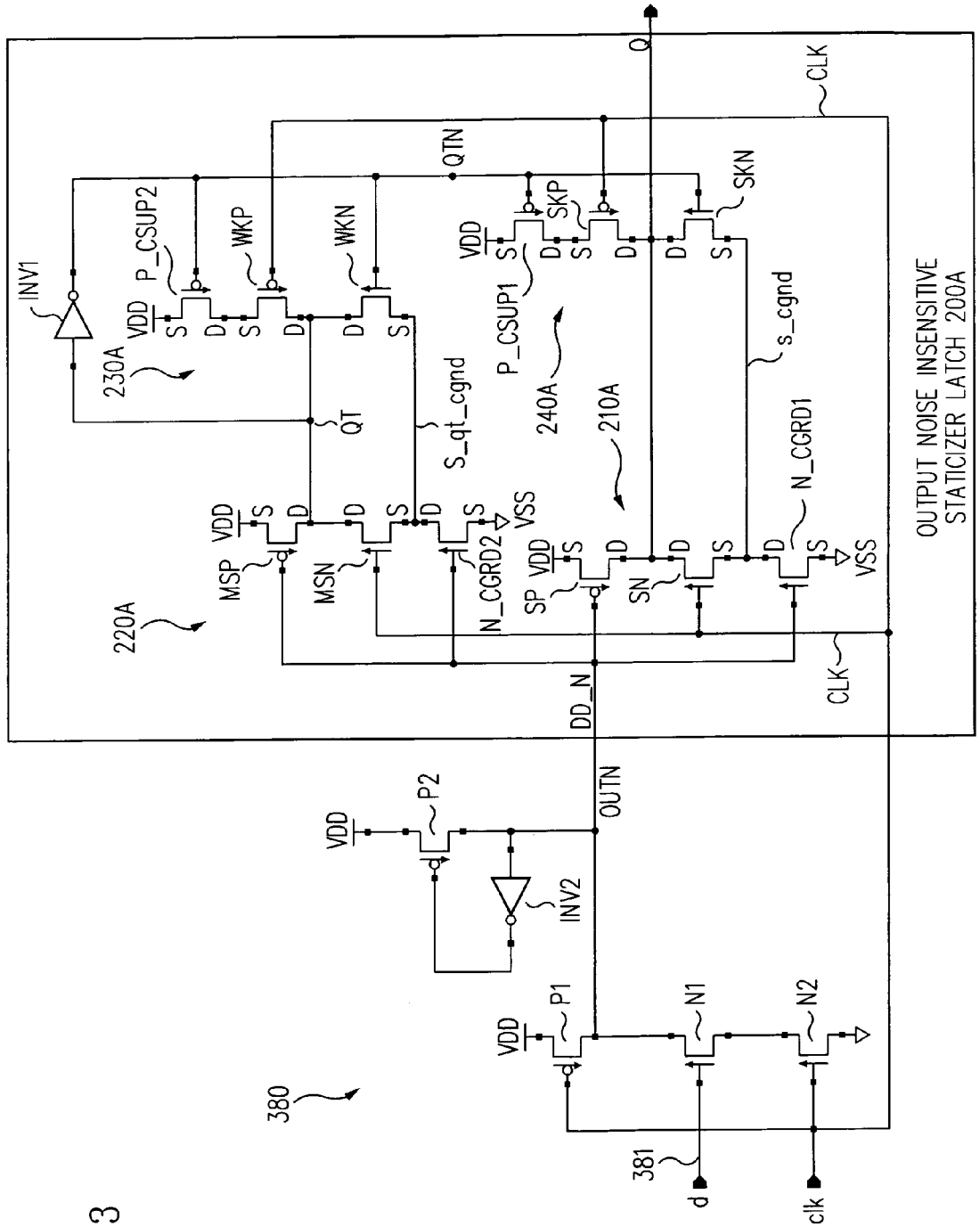
FIG. 3 is a more detailed diagram of one embodiment of the staticizer latch of FIG. 2.

FIG. 3 is a schematic diagram of a first embodiment of a non-ratio staticizer latch 200A with a fully static output signal on output terminal Q. In this embodiment, staticizer 210A includes p-channel transistor SP, and n-channel transistors N_GRD1 and SN Staticizer p-channel transistor SP, sometimes called p-channel transistor SP, has a source coupled to a first supply voltage VDD; a gate connected to dynamic data input terminal DD_N; and a drain connected to output terminal Q and to a drain of staticizer n-channel transistor SN, sometimes called n-channel transistor SN. Staticizer N-channel transistor SN has a gate connected to data clock line CLK and to output terminal Q, and a source connected to source common ground line s_cgnd. N-channel transistor N_CGRD1 has a drain connected to source common ground line s_cgnd; a gate connected to dynamic data input terminal DD_N; and a source coupled to a second supply voltage VSS.

In the embodiment of FIG. 3, mirror staticizer 220A includes p-channel transistor MSP, and n-channel transistors N_CGRD2 and MSN. P-channel transistor MSP has a source coupled to first supply voltage VDD; a gate connected to dynamic data input terminal DD_N; and a drain connected to a drain of mirror staticizer n-channel transistor MSN, sometimes called n-channel transistor MSN, and to storage node QT. Mirror staticizer n-channel transistor MSN has a gate connected to clock line CLK and a source connected to storage node common ground line s_qt_cgnd. N-channel transistor N_CGRD2 has a drain connected to storage node common ground line s_qt_cgnd; a gate connected to dynamic data input terminal DD_N; and a source coupled to second supply voltage VSS.

In the embodiment of FIG. 3, weak keep 230A includes an inverter INV1, a weak keeper p-channel transistor WKP, a p-channel transistor P_CSUP2, and a weak keeper n-channel transistor WKN. Strong enabled tri-state keeper 240A includes a strong keeper p-channel transistor SKP, a p-channel transistor P_CSUP1, and a strong keeper n-channel transistor SKN.

An input lead of inverter INV1 is connected to storage node QT. An output lead of inverter INV1 is connected to a not storage node QTN that in turn is connected to a gate of p-channel transistor P_CSUP2, to a gate of n-channel transistor WKN, to a gate of p-channel transistor P_CSUP1, and to a gate of n-channel transistor SKN.

A source of p-channel transistor P_CSUP2 is connected to first supply voltage VDD. A drain of p-channel transistor P_CSUP2 is connected to a source of weak keeper p-channel transistor WKP, sometimes called p-channel transistor WKP. A drain of p-channel transistor WKP is connected to storage node QT and to a drain of n-channel transistor WKN. A source of n-channel transistor WKN is connected to storage node common ground lead s_qt_cgnd.

A source of p-channel transistor P_CSUP1 is connected to first supply voltage VDD. A drain of p-channel transistor P_CSUP1 is connected to a source of strong keeper p-channel transistor SKP, sometimes called p-channel transistor SKP. A drain of p-channel transistor SKP is connected to output node Q and to a drain of n-channel transistor SKN. A source of n-channel transistor SKN is connected to common ground line s_cgnd.

In the embodiment of FIG. 3, dynamic logic stage 380 is a domino dynamic stack with a half keeper. Circuit 380 includes p-channel transistors P1 and P2, n-channel transistors N1 and N2 and an inverter INV2. The construction and operations of domino dynamic stack with a half keeper circuit 380 is equivalent to prior art circuits and so is known to those of skill in the art.

When the signal on input terminal D of dynamic logic stage 380 is asserted, e.g., goes from a low level to a high level 401 (FIG. 4), before the signal on clock data line CLK starts to rise and then signal 410 (FIG. 4) on line CLK starts to rise, signal level 420 on dynamic logic stage output line OUTN, sometimes called output line OUTN, discharges through n-channel transistors N1 and N2. The falling signal level on output line OUTN drives dynamic data input terminal DD_N.

The low signal level on dynamic data input terminal DD_N turns off n-channel transistor N_CGRD1 and turns on staticizer p-channel transistor SP. Since n-channel transistor N_CGRD1 is turned off, the pull-down path on output node Q is turned off.

Similarly, the low signal level on dynamic data input terminal DD_N turns off n-channel transistor N_CGRD2 and turns on mirror staticizer p-channel transistor MSP. Since n-channel transistor N_CGRD2 is turned off, the pull-down path on storage node QT is turned off also.

Thus, the low level signal on dynamic data input terminal DD_N turns off the pulldown paths on output node Q and not storage node QT. Consequently, mirror staticizer p-channel transistor MSP pulls up signal 440 on storage node QT and staticizer p-channel transistor SP pulls up signal 430 on output node Q.

For an asserted input signal 401 on terminal D when signal 410 on clock line CLK rises, the time delay from the rising clock edge to asserted signal 430 being available on terminal Q, the clock-q delay, is two gate delays. Inverter INV1 inverts asserted signal 440 on storage node QT and so signal 450 on not storage node QTN is driven low. The low signal level on node QTN (i) turns on p-channel transistor P_CSUP2 and p-channel transistor P_CSUP1, and (ii) turns off weak keeper n-channel transistor WKN and strong keeper n-channel transistor SKN.

Hence, when clock signal 411 on line CLK is de-asserted, e.g., falls, staticizer p-channel transistor. SP, which was holding output node Q high, turns off. Just as p-channel transistor SP is turned off, p-channel transistors P_CSUP2 and P_CSUP1 are turned on by the low signal level on line QT and low level signal 411 on clock line CLK turns on keeper p-channel transistors WKP and SKP.

Thus, in this, embodiment, low level signal 411 on clock line CLK enables weak keeper 230A and strong keeper 240A. Thus, weak keeper 230A keeps storage node QT at a high level, and strong keeper 240A keeps output node Q at a high level. The keeper paths on storage node QT and output node Q seamlessly take over.

Hence, in this embodiment, during evaluation for the dynamic logic, staticizer 210A drives output node Q and mirror staticizer 220A drives storage node QT in parallel. To provide a rapid transition on output node Q, the transistors in staticizer 210A are sized larger, i.e., sized to provide more drive than the transistors in mirror staticizer 220A that requires less drive than staticizer 210A. In precharge for the dynamic logic following the evaluation, strong keeper 240A holds output node Q at a high level based on the input signal from weak keeper 230A and the enabling low clock signal. Weak keeper 230A holds storage node QT at the high level during the precharge phase for the dynamic logic.

When the signal on input terminal D of dynamic logic stage 380 is de-asserted, e.g., goes from a high level to a low level 402 (FIG. 4), before the signal on line CLK starts to rise and then signal 412 on line CLK starts to rise, n-channel transistor N1 is turned off, and output keeper p-channel transistor P2 holds high level signal 421 on output line OUTN. High signal level 421 on line OUTN drives dynamic data input terminal DD_N.

The high signal level on dynamic data input terminal DD_N keeps mirror staticizer p-channel transistor MSP and staticizer p-channel transistor SP turned-off, and n-channel transistors N_CGRD1 and N_CGRD2 turned on. Rising clock signal 412 turns on staticizer n-channel transistor SN and mirror staticizer n-channel transistor MSN.

Hence, the pull-down path on output node Q is turned on, and the pull-down path on storage node QT is also turned on. Signal 431 on output node Q and signal 441 on storage node QT are both pulled down. Thus, for a de-asserted input signal 402 on terminal D when signal 412 on clock line CLK rises, the time delay from the rising clock edge to the de-asserted signal being available on terminal Q, the clock-q delay, is one gate delay.

Inverter INV1 inverts the de-asserted signal on storage node QT and so signal 451 on not storage node QTN is driven high. High signal 451 on node QTN (i) turns off p-channel transistor P_CSUP2 and p-channel transistor P_CSUP1, and (ii) turns on weak keeper n-channel transistor WKN and strong keeper n-channel transistor SKN.

Hence, when signal 413 on clock line CLK is de-asserted, e.g., falls, staticizer n-channel transistor SN, which was holding output node Q low with n-channel transistor N_CGRD1, and mirror staticizer n-channel transistor MSN, which was holding storage node QT low with n-channel transistor N_CSUP2, are turned off. Just as n-channel transistors SN and MSN are turned off, n-channel transistors WKN and SKN are turned on by high signal level 451 on node QTN.

Thus, the pull down path through n-channel transistors WKN and N_CGRD2 keeps signal 441 on storage node QT at a low level. The pull down path through n-channel transistors SKN and N_CGRD1 keep signal 431 on output node Q at a low level. Thus, weak keeper 230A keeps storage node QT at a low level, and strong keeper 240A keeps output node Q at a low level. The keeper paths on storage node QT and output node Q seamlessly take over.

If the input signal on terminal D does not transition, but remains at low level 403 when signal 414 on clock line CLK rises, signal 422 on output line OUTN remains at a high level and so signal 442 on storage node QT and signal 432 on output node Q both remain at a low level through both evaluation and precharge. Thus, signal 452 on node QTN remains at a high level through both evaluation and precharge that in turn assures that both the signals on storage node QT and output node Q remain seamlessly at a low level during clock transition 415.

If input signal 404 on input terminal D does not transition and remains high when signal 416 on clock line CLK transitions from low to high, n-channel transistor N1 turns on, and signal 423 on output line OUTN discharges through n-channel transistors N1 and N2. Since there is one gate delay from signal 423 on clock line CLK transitioning to a high level to signal 423 on output line OUTN falling, mirror staticizer n-channel transistor MSN, staticizer n-channel transistor SN, and n-channel transistors N_CGRD1 and N_CGRD2 are on during this delay. This produces a characteristic staticizer dip glitch 433 on output terminal Q and a characteristic staticizer dip glitch 443 on storage node QT.

Inverter INV1 attenuates the glitch that is seen on node QTN, which shows a much smaller bump. The much smaller bump on node QTN is pulled back down as the signal levels on storage node QT and output node Q are driven up by mirror staticizer p-channel transistor MSP and staticizer p-channel transistor SP, respectively, when the signal on output line OUTN goes low.

In one simulation, glitch 433 on output terminal Q was pulled back up 22 picoseconds (ps) after the signal on clock line CLK went high, which was faster than the zero to one transition time of 27 ps in the simulation. This behavior is expected since the signal on output terminal Q is not pulled all the way down to second supply voltage VSS by glitch 433. Thus, the signal on output terminal Q has a head start on the way up, and is faster back to first supply voltage VDD than it would be had it started off from second power supply voltage VSS on zero to one transition 401.

After glitch 433 is resolved and the bump on node QTN settles, the response of staticizer 220A is similar to the response described above for zero to one transition 401. The signal on node QTN is already low and the signals on the source of p-channel transistor WKP and the source of p-channel transistor SKP are driven to first power supply voltage VDD.

As signal 417 on clock line CLK goes low, p-channel transistors WKP and SKP turn on and so p-channel keeper transistors, WKP and SKP drive the P-keeper paths to storage node-QT and output node Q, respectively, before signal 424 on line OUTN goes high and turns off staticizer p-channel transistor SP and mirror staticizer p-channel transistor MSP. Again, nodes QT and Q are seamlessly driven during both evaluate and precharge.

Various alternative embodiments of both dynamic logic stage 280 and output noise insensitive staticizer latch 200 can be implemented by those of skill in the art in view of the above description. Accordingly, the following embodiments are presented as illustrations and are not intended to limit the invention to the specific further examples presented below.

Figure 5:
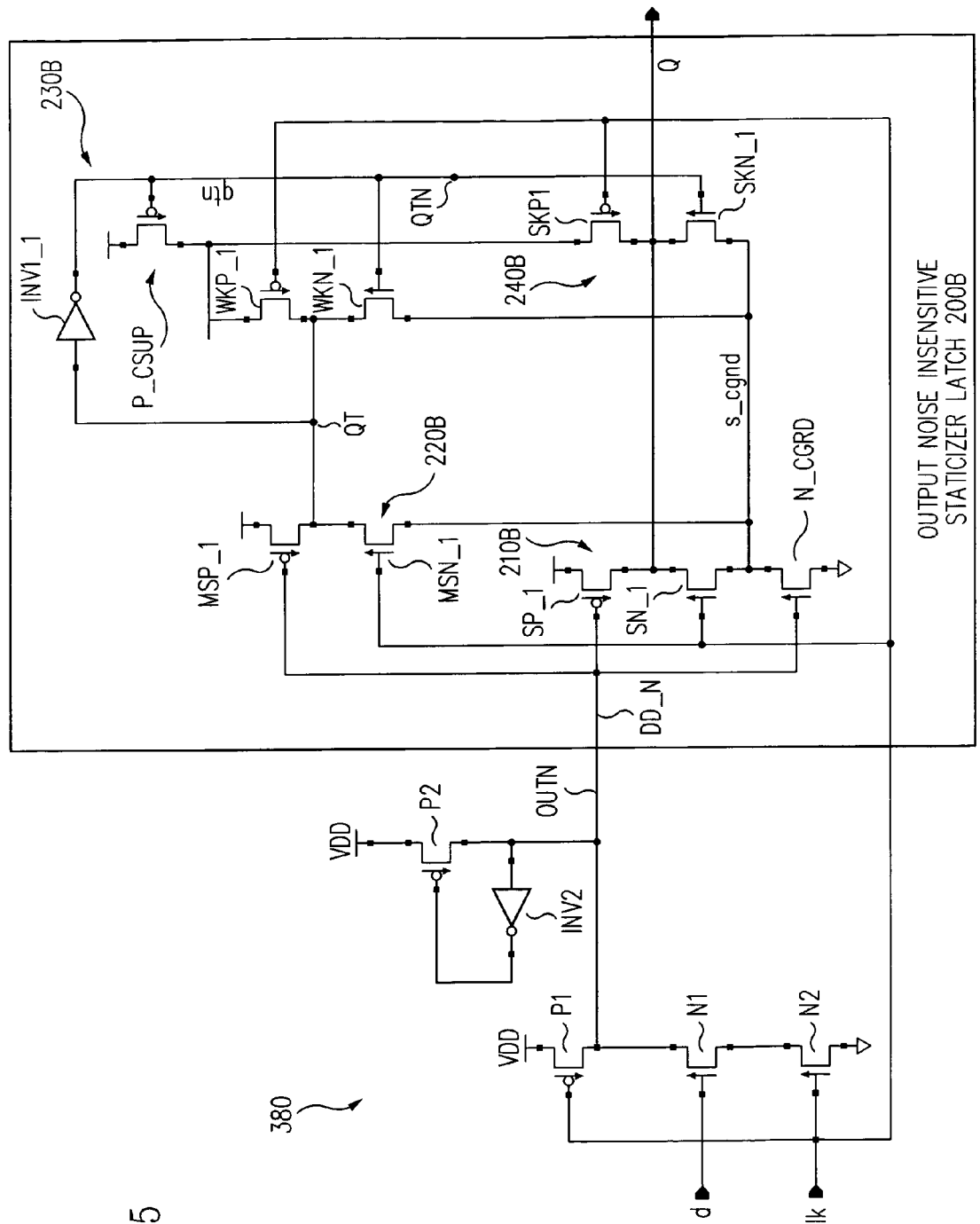
FIG. 5 is a more detailed diagram of another embodiment of the staticizer latch of FIG. 2.

FIG. 5 is an illustration of an alternative embodiment 200B of output noise insensitive staticizer latch 200. Dynamic logic 380 is that same manner as that described above with respect to FIG. 3 and that description is incorporated herein by reference.

Output noise insensitive staticizer latch 200B is similar to output noise insensitive staticizer latch 200A. However, n-channel transistors N_CGRD1 and N_CGRD2 in latch 200A have been combined into a single n-channel transistor N_CGRD in latch 200B. Also, p-channel transistors P_CSUP1 and P_CSUP2 in latch 200B have been combined into a single p-channel transistor P_CSUP.

More specifically, transistors SP_1 and SN_1 in staticizer 210B are equivalent to transistors SP and SN, respectively in staticizer 210A. Transistor N_CGRD1 in staticizer 210A is replaced with transistor N_CGRD in staticizer 210B.

Transistors MSP_1 and MSN_1 in mirror staticizer 220B are equivalent to transistors MSP and MSN, respectively in mirror staticizer 220A. However, transistor N_CGRD2 in mirror staticizer 220A is replaced with transistor N_CGRD. Thus, the source of mirror staticizer n-channel transistor MSN_1 is connected to line s_cgnd.

Transistors WKP_1 and WKN_1 in weak keeper 230B are equivalent to transistors WKP and WKN, respectively in weak keeper 230A. However, the source of WKN_1 is connected to line s_cgnd. Also, transistor P_CSUP2 in weak keeper 230A is replaced with transistor P_CSUP.

Transistors SKP_1 and SKN_1 in strong keeper 240B are equivalent to transistors SKP and SKN, respectively in strong keeper 240A. However, transistor P_CSUP1 in strong keeper 240A is replaced with transistor P_CSUP. Thus, the source of strong keeper p-channel transistor SKP_1 is connected to the drain of transistor P_CSUP.

Figure 4:
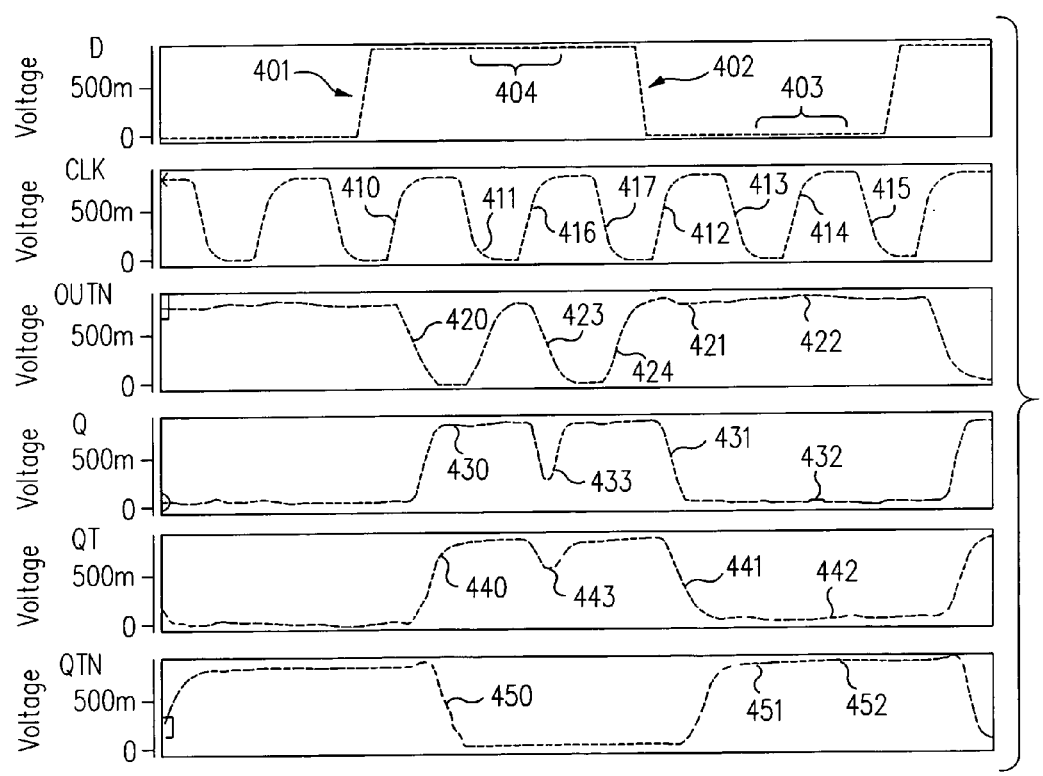
FIG. 4 is a timing diagram to illustrate the operation of the various embodiments of the latches, according to one embodiment of the present invention.

The operation of latch 200B is equivalent to that described above for latch 200A in view of the changes described for latch 200B. The timing diagram of FIG. 4 applies to latch 200B. Accordingly, the above description of the operation of latch 200A and the timing diagram of FIG. 4 are incorporated herein by reference for latch 200B.

Output noise insensitive staticizer latch 200C1 (FIG. 6A) is similar to output noise insensitive staticizer latch 200A except weak keeper 230C is implemented using a weak feedback inverter keeper. Unlike weak keeper 230A that was enabled when the clock signal was low, weak keeper 230C does not receive the clock signal.

In output noise insensitive staticizer latch 200C1, node QTN from inverter INV1_2 is connected to strong keeper 240A in the same manner as described above for weak keeper 230A and strong keeper 240A. However, transistors P_CSUP2, WKP and WKN of weak keeper 230A are not used in weak keeper 230C. Instead, inverter INV3 has an input lead connected to node QTN, and an output lead connected to storage node QT.

The operation of latch 200C1 is equivalent to that described above for latch 200A, and so is not repeated with weak keeper 230C. In view of the above description, those of skill in the art can follow the operation with the inverters in weak keeper 230C.

Figure 6A:
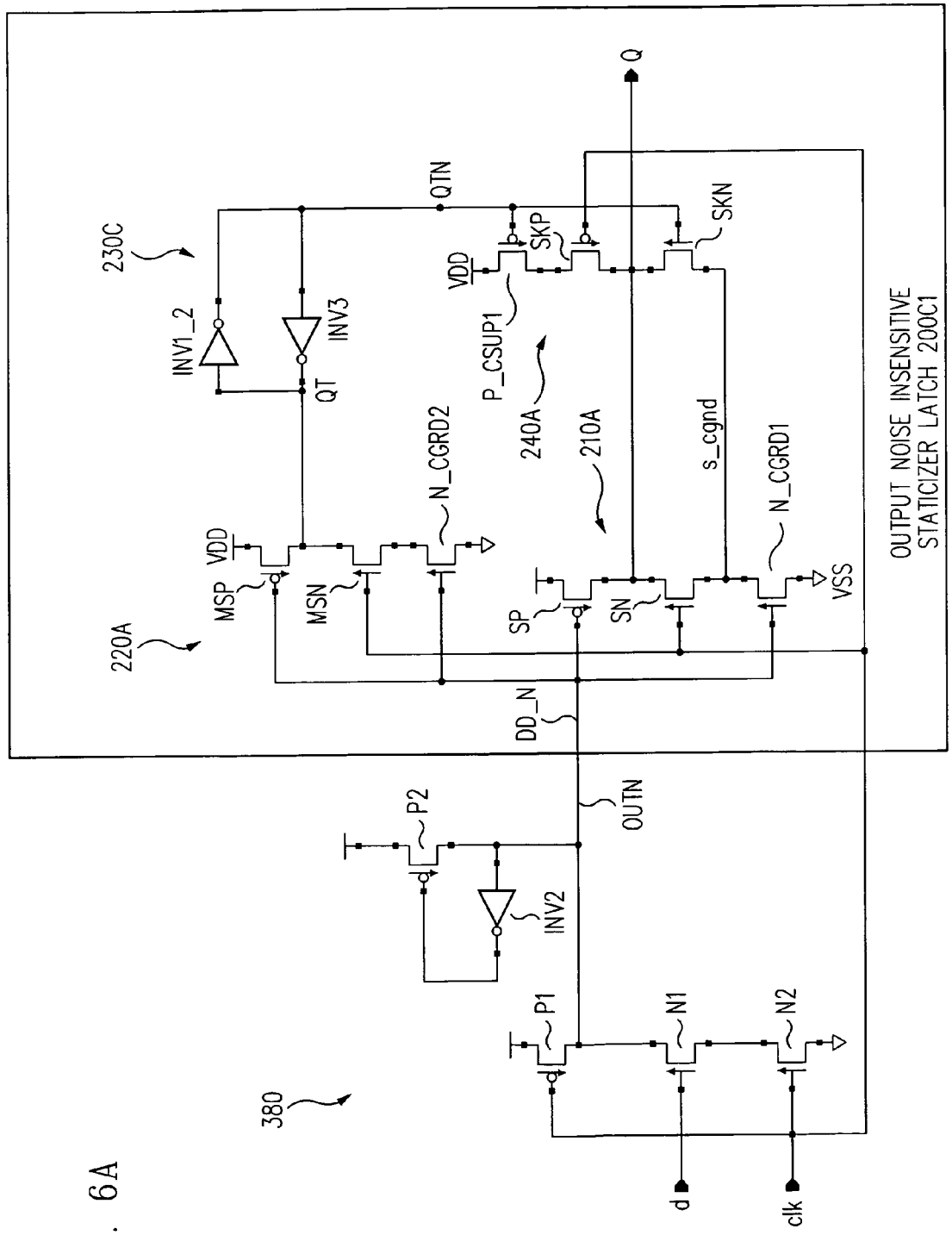
FIG. 6A is a more detailed diagram of yet another embodiment of the staticizer latch of FIG. 2.
Figure 6B:
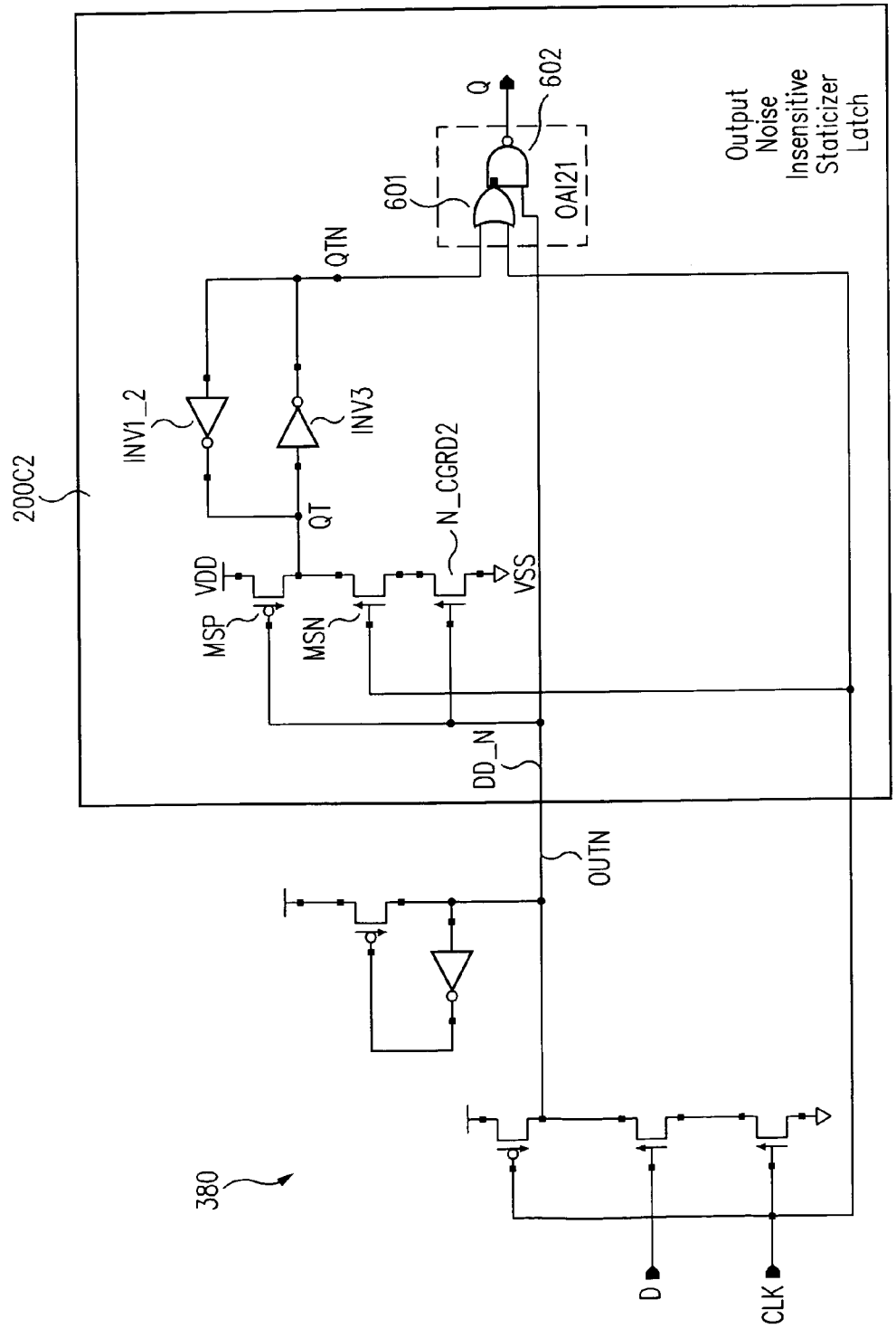
FIG. 6B is an alternative representation of the staticizer latch of FIG. 6A.

FIG. 6B illustrates output noise insensitive staticizer latch 200C2 with is fully equivalent to output noise insensitive staticizer latch 200C1 except a gate representation is presented. In this embodiment, the transistors of staticizer 210A (FIG. 6A) and strong enabled tri-state keeper 240A (FIG. 6A) are represented by an or-and-invert-21 gate OAI21. In FIG. 6B, a logic representation of or-and-invert-21 gate OAI21 is presented. It should be understood that OR gate 601 and NAND gate 602 are logical representations only and do not physically exist. The transistors in the circuits of FIGS. 6A and 6B are identical.

Hence, the operation of latch 200C2 is identical to the operation of latch 200C1 described previously. Latch 200C1 has a one gate d-q delay and isolates storage node QT from output node Q. Also, as indicated, storage node QT is being written at the same time that output node Q is being driven.

Figure 7:
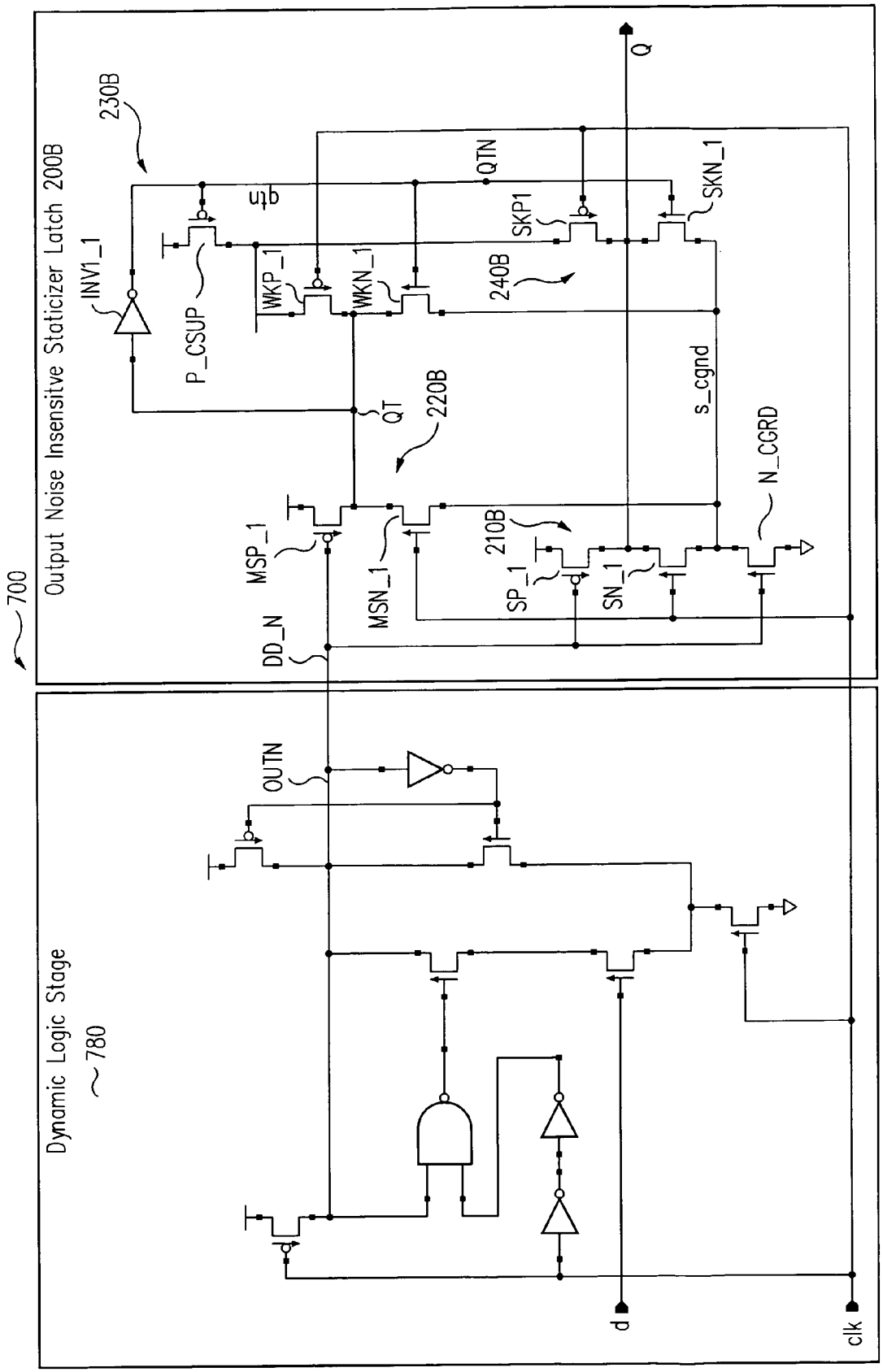
FIG. 7 is an illustration of a novel semi-dynamic flip-flop that includes one embodiment of the staticizer latch of FIG. 2.

FIG. 7 is yet another embodiment that utilizes output noise insensitive latch 200B with a different dynamic logic stage 780. Dynamic logic stage 780 is a semi-dynamic flip-flop dynamic stage equivalent to the prior art semi-dynamic flip-flop dynamic stage. However, the combination of semi-dynamic flip-flop dynamic stage and output noise insensitive latch 200B is a novel semi-dynamic flip-flop 700 in view of the performance advantages of latch 200B.

The use of latch 200B in semi-dynamic flip-flop 700 is illustrative only and is not intended to limit semi-dynamic flip-flop 700 to this specific embodiment. For example, either latch 200A or latch 200C1 could be used in place of latch 200B.

Figure 8A:
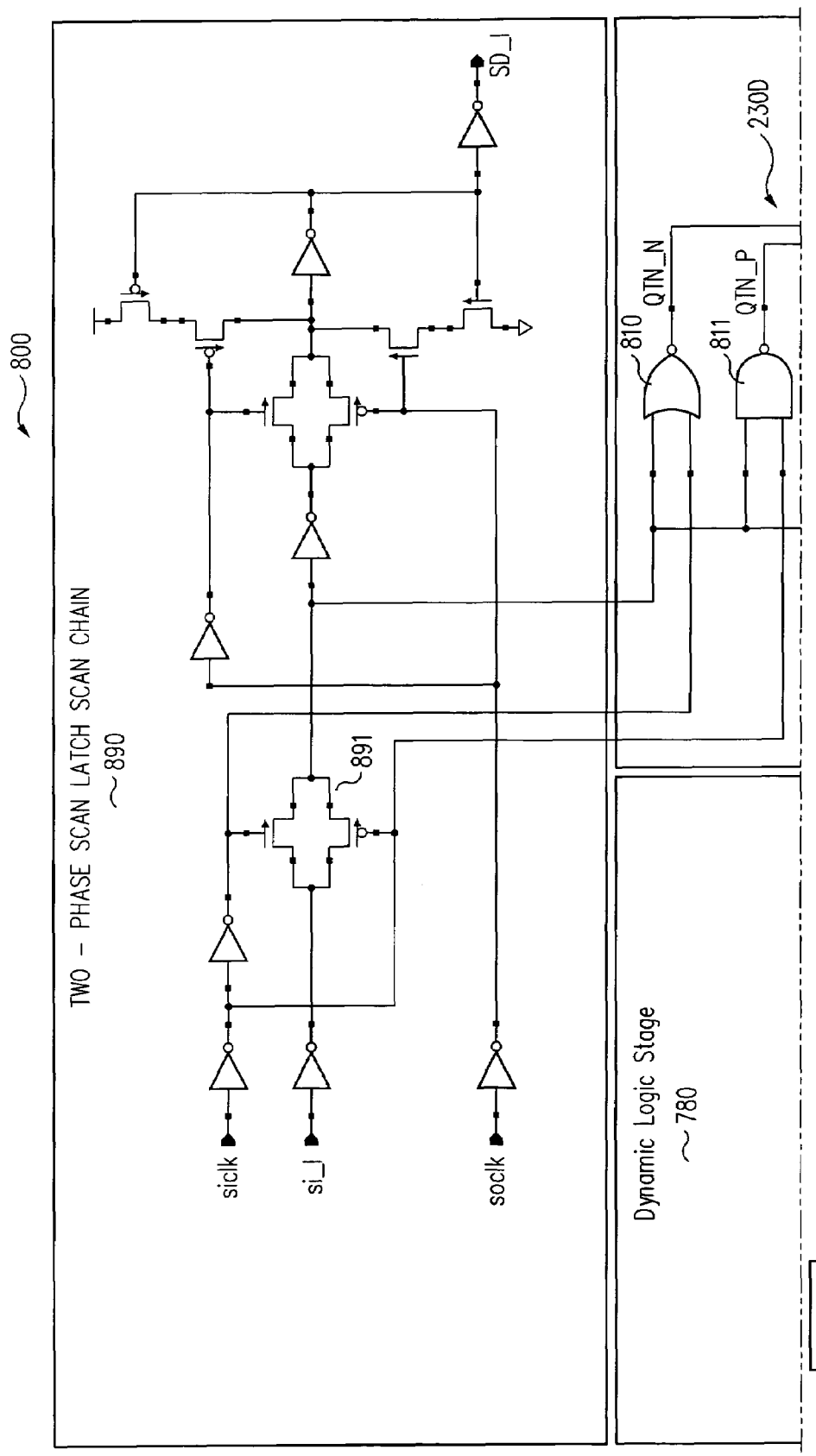
FIG. 8 is an illustration of the novel semi-dynamic flip-flop of FIG. 7 that includes a scan capability according to one embodiment of the present invention.
Figure 8B:
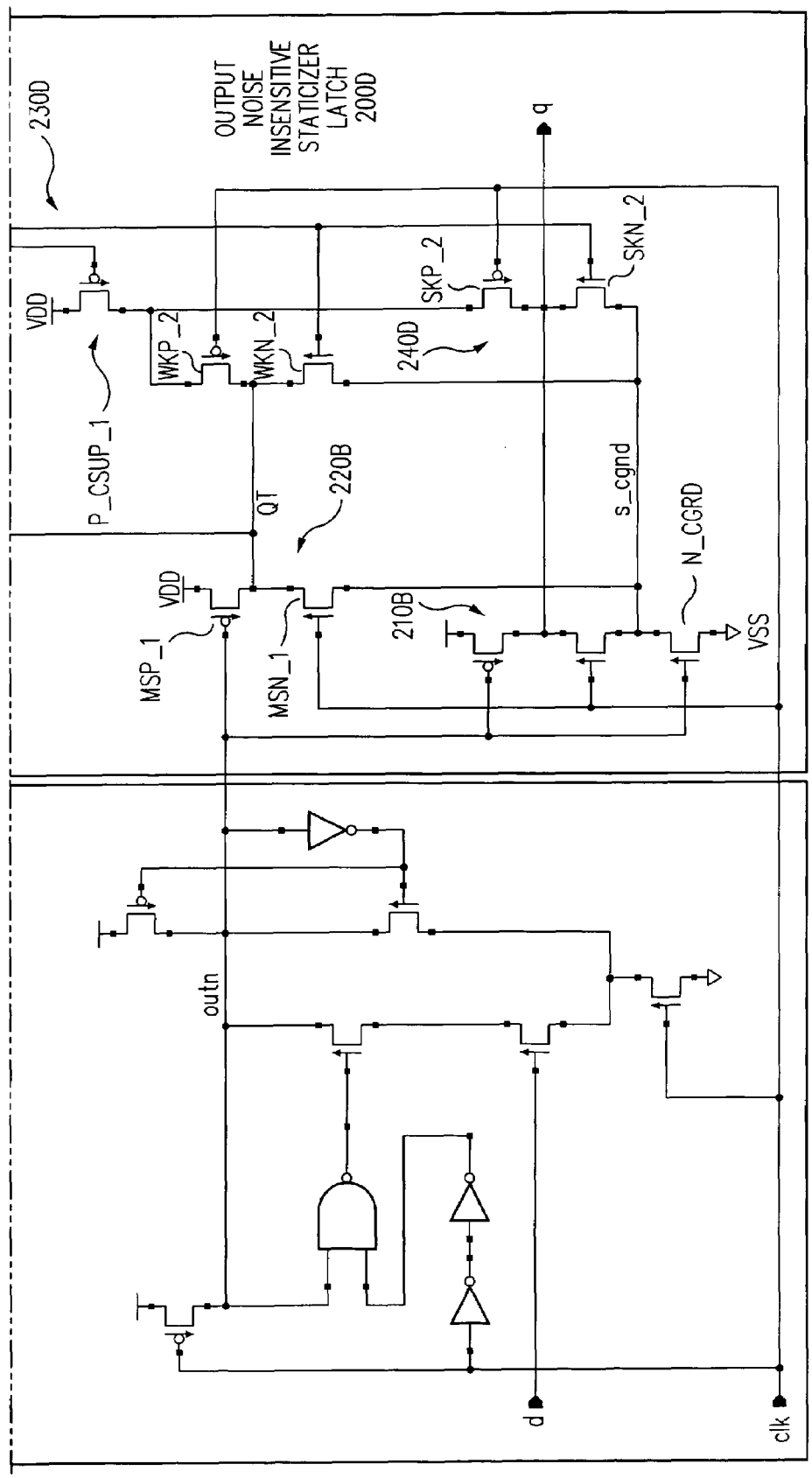

FIG. 8 illustrates semi-dynamic flip-flop 800 with modifications to flip-flop 700 to include flip-flop 700 in a scan chain. In this embodiment, a two-phase scan-latch scan chain 890 is used to shift in the scan data into static stage 200D of semi-dynamic flip-flop 800, without negatively effecting the evaluation time of dynamic logic stage 780. Semi-dynamic flip-flop 800 is especially well suited for this approach, and only minor modifications are required to disable keeper 240D on output node Q and to disable keeper 230D on storage node QT when new data is being scanned in.

No additional load is added on data clock line CLK, output node Q, or dynamic output node OUTN, so the performance impact from adding scan capability is negligible. Node QTN is split into two separate lines, line QTN_P line and line QTN_N.

Line QTN_P controls the p-channel keepers in that line QTN_P is connected to the gate of p-channel transistor P_CSUP_1. Line QTN_P is also connected to an output terminal of NAND gate 811.

Line QTN_N controls the n-channel keepers in that line QTN_N is connected to the gate of weak keeper n-channel transistor WKN_2 and to the gate of strong keeper n-channel transistor SKN_2. Line QTN_N is also connected to an output terminal of NOR gate 810

A first input terminal of NAND gate 811 is connected to storage node QT. A second input terminal of NAND gate 811 is connected to a one inverter delayed scan in clock signal. A first input terminal of NOR gate 810 is connected to storage node QT. A second input terminal of NOR gate 810 is connected to a two inverter delayed scan in clock signal. All other connections and transistors in latch 200D are the same as described for latch 200B above and that description is incorporated herein by reference.

To scan data in, the signals on data clock line CLK to dynamic logic stage 780 are disabled and dynamic logic stage 780 goes into precharge. Thus, output node Q is controlled by keeper 240D.

Scan-out clock soclk is pulsed, latching the value on output node Q into the slave scan latch. After scan-out clock soclk goes low, scan-in clock siclk is pulsed, turning on passgate 891 connecting scan in node si to storage node QT, at the same time driving the signal on line QTN_P high and the signal on line QTN_N low via NOR gate 810 and NAND gate 811, respectively. This disables keepers 230D and 240D and lets the scan in data overwrite the value in storage node QT.

When scan in clock siclk goes down again, the keepers are again enabled and propagate the new value stored in storage node QT to output node Q. This overwrites the state of latch 200D with the scanned in data. At this point, scan out clock soclk can go up again, and the process repeats.

The previous embodiments utilized a dynamic logic stage followed by an embodiment of output noise insensitive staticizer latch 200. However, the principles of this invention are also applicable to static storage elements, such as static latches, and to other logic elements, i.e., elements having a static input signal.

Figure 9A:
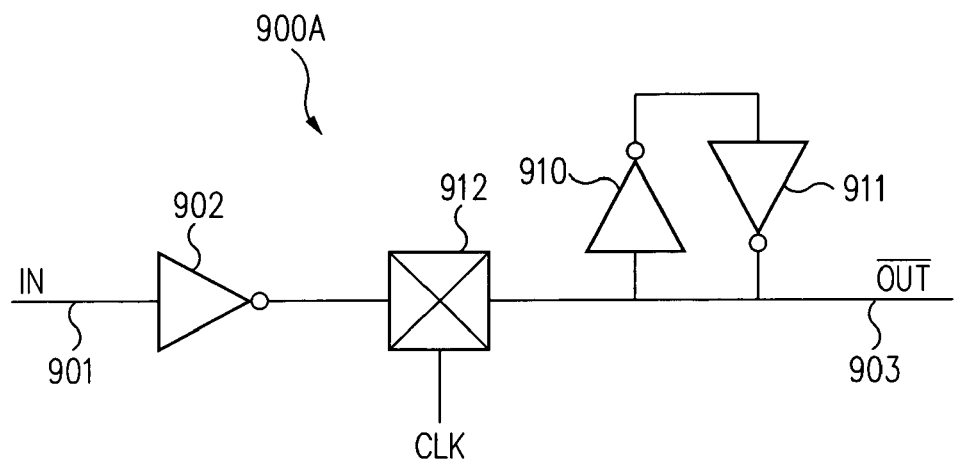
FIG. 9A is an illustration of a prior art latch used with a static input signal.

For example, FIG. 9A is a prior art static latch 900A with a static input signal on line 901 to an inverter 902. The output signal of inverter 902 is an input signal to a transmission gate 912 that passes the signal to output line 903 when the signal on data clock line CLK is asserted. When the clock signal is de-asserted, inverters 910 and 911 maintain the signal level on output line 903. If noise should occur on line 903, it is possible that inverters 910 and 911 change state and change the state of the signal on line 903. Thus, the output signal of prior art latch 900A is sensitive to noise on output line 903.

Figure 9B:
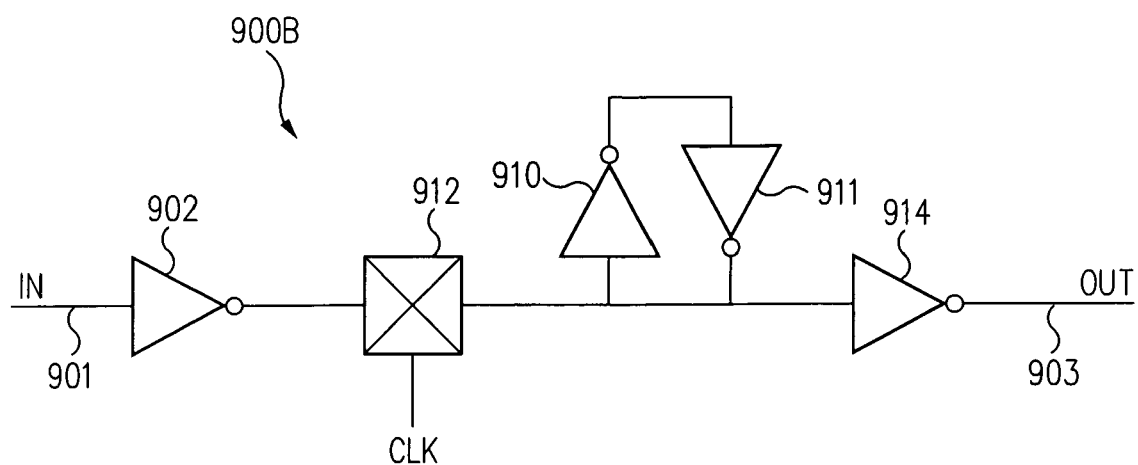
FIG. 9B is an illustration of a prior art latch of FIG. 9A with an inverter in the output line to eliminate noise on the output line changing the state of the latch.

FIG. 9B illustrates a common method used to eliminate the noise problem on output line 903. An inverter 914 is placed in output line 903 to isolate the weak keeper from output line 903 in latch 900B. However, this introduces additional delay in the d-q delay. The other components in latch 900B are the same as just described for latch 900A.

Figure 10A:
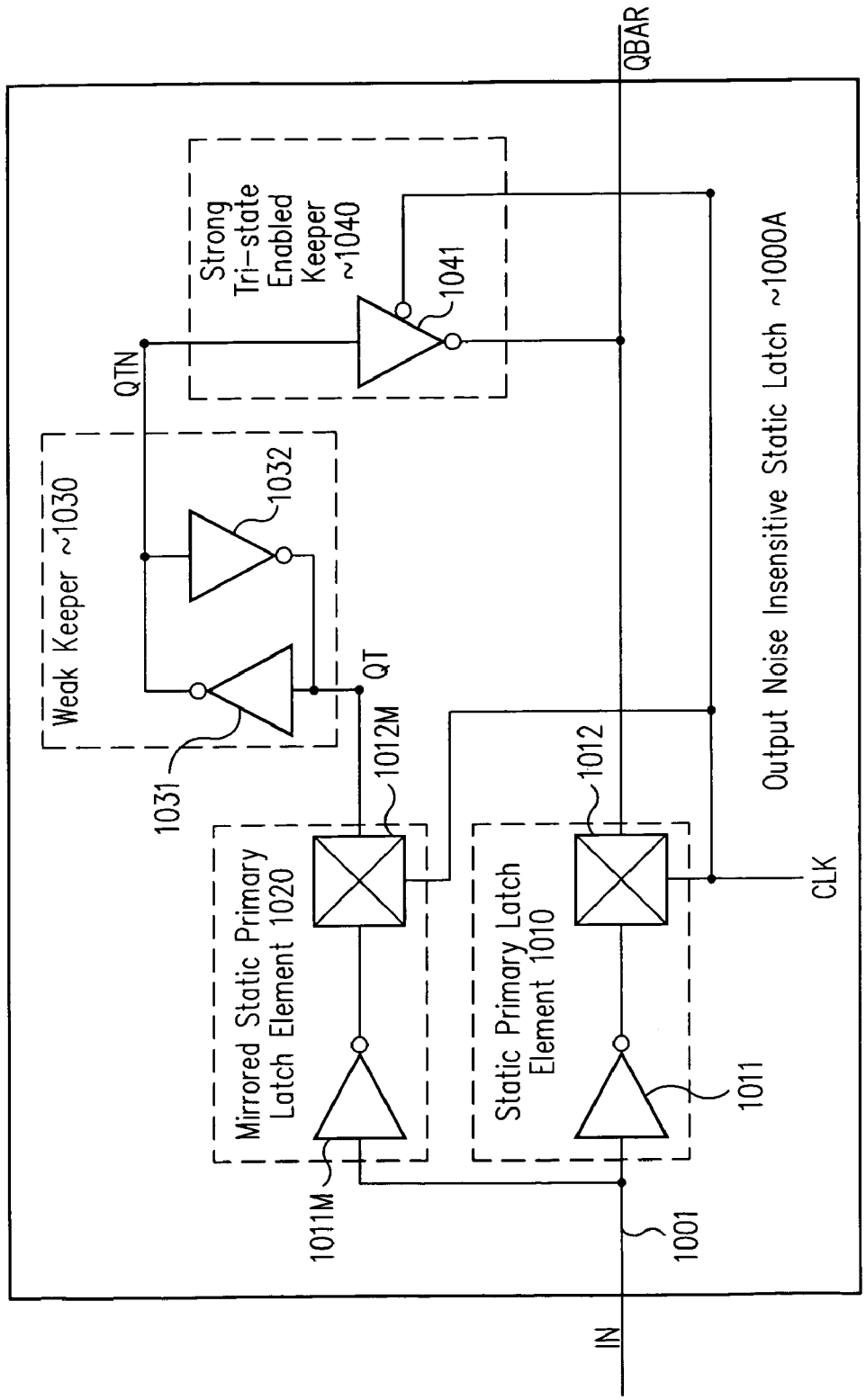
FIG. 10A is an illustration of one embodiment of the output noise insensitive static latch for use with a static input signal.

FIG. 10A is a first embodiment of an output noise insensitive static latch 1000A that eliminates the noise problem on output line 903 of prior art latch 900A and does not introduce additional delay in the signal on the output line as in prior art latch 900B. In this example, static primary element 1010 includes an inverter 1011 and a transmission gate 1012 that are equivalent to inverter 902 and transmission gate 912, respectively. An output line of static primary element 1010 is connected to output node QBAR.

Connected in parallel with the input line to static primary element 1010 is mirrored static primary element 1020 that includes an inverter 1011M and a transmission gate 1012M. An input terminal of inverter 1011M is connected to input line 1001 and an output terminal of inverter 1011M is connected to an input terminal of transmission gate 1012M. Transmission gate 1012M is connected to data clock line CLK, and passes the signal on its input terminal to the output terminal when the signal on data clock line CLK is asserted. The output terminal of transmission gate 1012M is connected to storage node QT.

Weak keeper 1030 is connected to storage node QT. In this embodiment, inverter 1031 has an input terminal connected to storage node QT and an output node connected to not storage node QTN. Inverter 1032 has an input terminal connected to not storage node QTN and an output node connected to storage node QT.

Strong tri-state enabled keeper 1040 has an input terminal connected to not storage node QTN, and an output terminal connected to node QBAR. An enable terminal of keeper 1040 is connected to data clock line CLK.

When the signal on data clock line CLK is asserted, static primary element 1010 drives node QBAR, and mirrored static primary element 1020 drives storage node QT, in parallel. When the signal on data clock line CLK is de-asserted, weak keeper 1030 maintains the state of the signal on storage node QT and drives a signal that is the complement of the signal on storage node QT on node QTN. When the data clock is de-asserted strong tri-state enabled keeper 1040 is enabled, and drives the complement of the signal of node QTN on node QBAR.

Figure 10B:
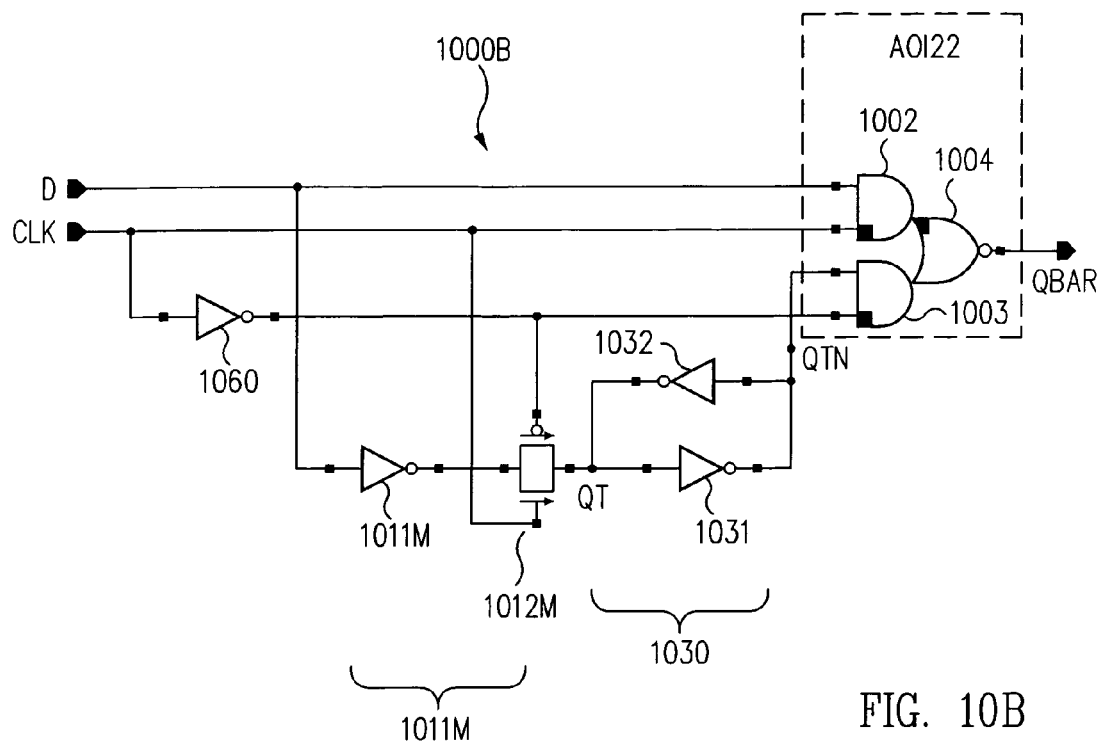
FIG. 10B is an alternative representation of the output noise insensitive static latch for use with a static input signal of FIG. 10A.

FIG. 10B illustrates output noise insensitive static latch 1000B, which is equivalent in operation to output noise insensitive static latch 1000A except an AOI22 gate implementation is presented. In this embodiment, static primary latch element 1010 (FIG. 10A) and strong enabled tri-state keeper 1040 (FIG. 10A) are combined in an and-or-invert-22 gate AOI22.

AND gate 1002, AND gate 1003 and NOR gate 1004 are a logical representation of an and-or-invert-22 gate AOI22, but these gates do not physically exist. The AOI22 gate is used as an inverting multiplexer with the clock signal functioning as the select signal.

Hence, the operation of latch 1000B is identical to the operation of latch 1000A, described previously. The load on input terminal D of latch 1000B is one inverter and the AOI22 gate, while output terminal QBAR is driven by the AOI22 gate. Storage node QT is isolated from both input terminal D and output terminal QBAR by a CMOS logic gate.

Latch 1000B has a one gate d-q delay and isolated storage node QT from output node QBAR, while maintaining a gate only input. This allows the latch overhead to be reduced, and in many cases, allows circuits using latches to be clocked faster.

Also, as indicated, storage node QT is being written at the same time that output node QBAR is being driven. This allows a time saving of one gate delay relative to a pass gate latch, where the storage node is written and then this storage node in series drives the output inverter.

Figure 10C:
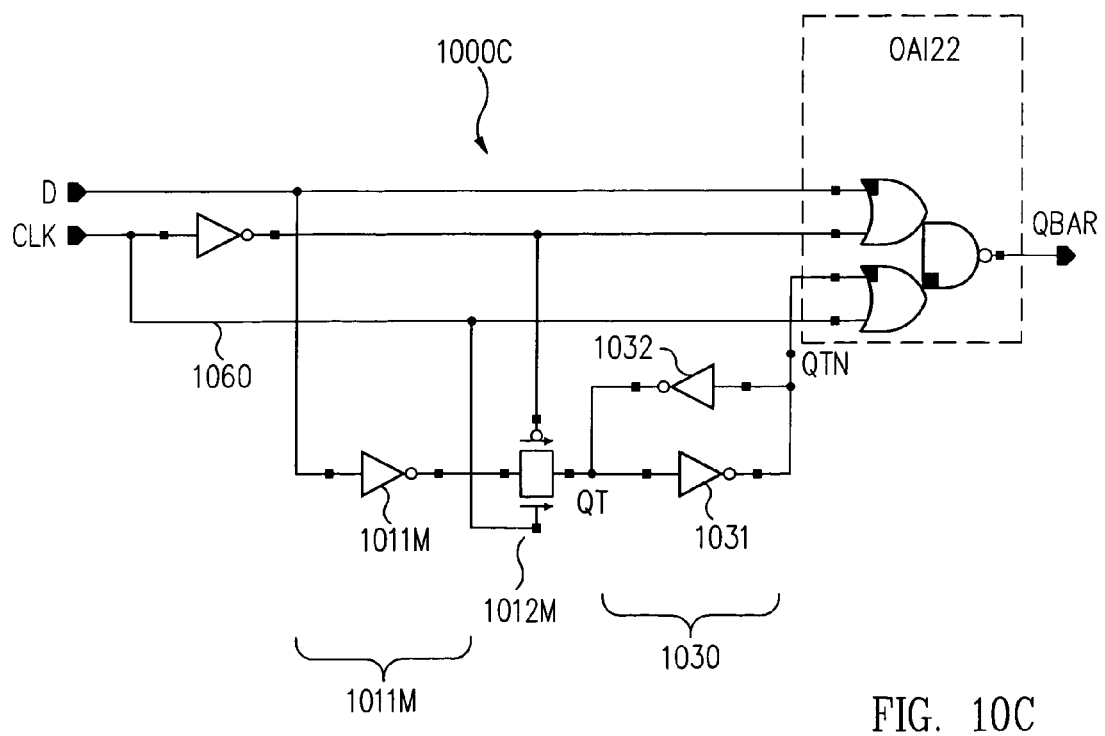
FIG. 10C is another alternative representation of the output noise insensitive static latch for use with a static input signal of FIG. 10A.
Figure 11A:
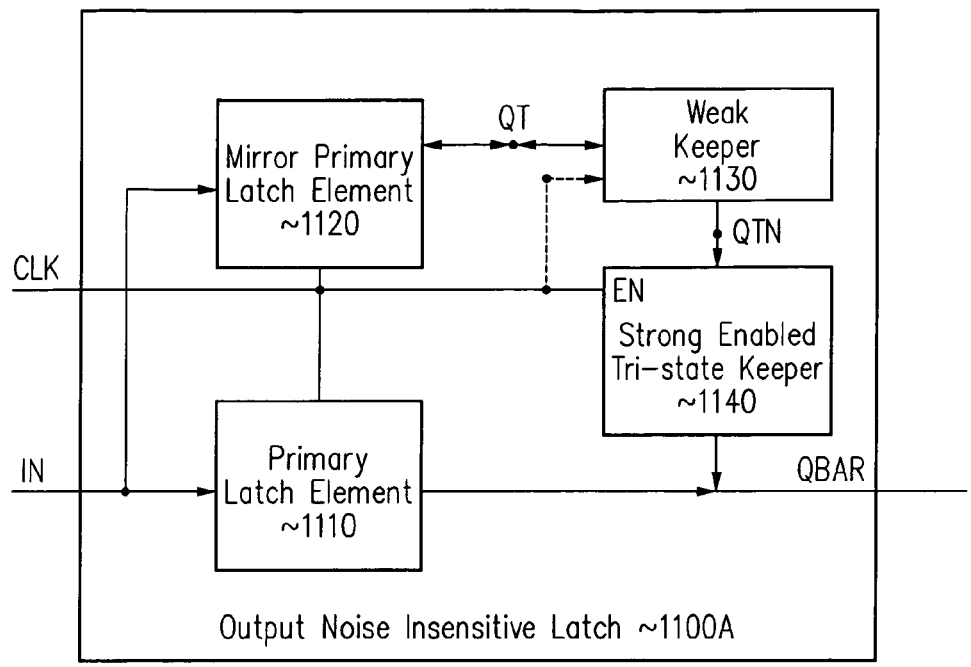
FIG. 11A is an illustration of one embodiment of a general output noise insensitive latch, according to one embodiment of the present invention.
Figure 11B:
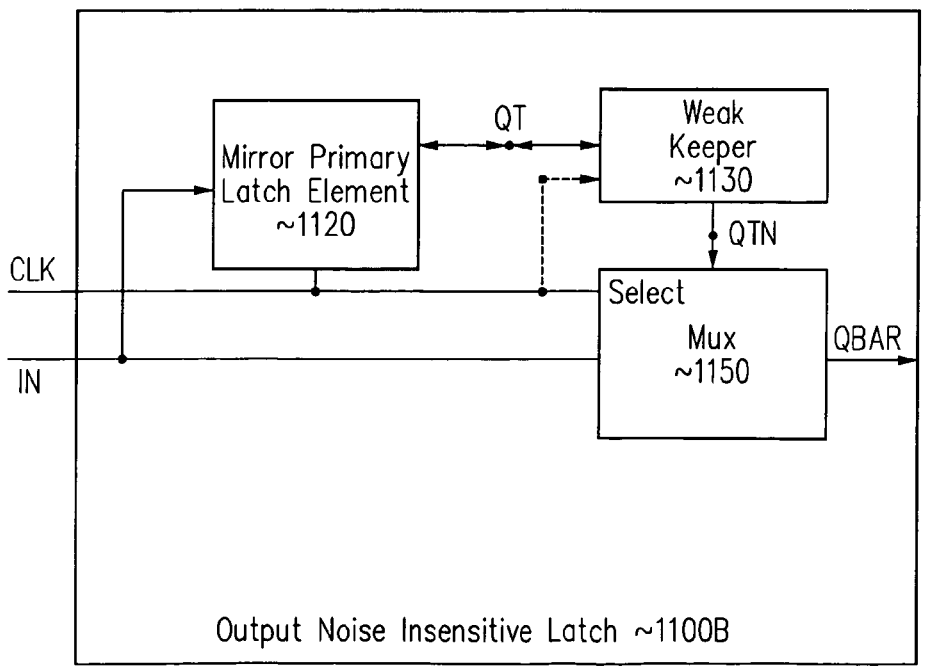
FIG. 11B is an illustration of another embodiment of a general output noise insensitive latch, according to one embodiment of the present invention.

FIG. 10C is a latch 1000C that utilizes an or-and-invert-22 gate OAI22. The implementation of the OAI22 gate is derived from the AOI22 gate using DeMorgan's law. According, in view of the description of FIGS. 10A and 10B, the operation of latch 1000C is fully equivalent and so is not repeated.

The static primary element used in FIG. 10A is illustrative only and is not intended to limit the invention to this specific embodiment. In view of this disclosure, other static elements suitable for use in a latch circuit can be used as the static primary latch element and the mirrored static primary latch element.

In view of the embodiments of FIGS. 2, and 10A to 10C, FIG. 11A is an example of an embodiment of an output noise insensitive latch 1100A that includes both embodiments. Thus, in FIG. 11A, primary latch element 1110 can be either a static primary latch element that receives static input data, as in FIGS. 10A to 10C, or a staticizer that receives dynamic input data, as in FIG. 2. Mirror primary latch element 1120 has an input line connected in parallel with an input line of primary latch element 1110 and mirrors the operation of primary latch element 1110 in that mirror primary latch element 1120 drives a signal, with the same state as the output signal, on storage node QT. An output terminal of primary latch element 1110 is connected to node QBAR. An output terminal of mirror primary-latch element 1120 is connected to storage node QT.

An input terminal of a weak keeper 1130 is connected to storage node QT; a not storage node terminal of weak keeper 1130 is connected to not storage node QTN; and an output terminal of weak keeper 1130 is connected to storage node QT.

Strong enabled tri-state keeper 1140 has an input terminal connected to not storage node QTN and an output terminal connected to node QBAR. Data clock line CLK is connected to primary latch element 1110, mirror primary latch element 1120, strong enabled tri-state keeper 1140 and optionally to weak keeper 1130.

When the signal on data clock line CLK is asserted, primary latch element 1110 drives node QBAR, and mirror primary latch element 1120 drives storage node QT. When the signal on data clock line CLK is de-asserted, weak keeper 1130 maintains the signal level, i.e., state, of storage node QT and drives the complement of the signal on storage node QT on not storage node QTN.

When the signal on data clock line CLK is de-asserted, strong enabled tri-state keeper 1140 is enabled and maintains the state of node QBAR, i.e., maintains the signal level on node QBAR. Specifically, keeper 1140 drives the complement of the signal on not storage node QTN on node QBAR.

Since storage node QT is isolated from node QBAR, noise on the output line connected to node QBAR cannot change the state of keepers 1130 and 1140. Accordingly, latch 1100A is insensitive to noise on the output line. Also, since no additional elements are inserted between primary latch element 1110 and output node QBAR, no additional output signal delay is incurred in providing the output noise insensitivity.

Thus, a method for reducing the effects of noise on an output line of a latch includes mirroring an input node of the latch with a storage node that is parallel to the input node. The method includes isolating the storage node from the output node so that noise on the output node does not change the state of the signal on the storage node. The method also includes driving the output node with an inverse of an input signal when a clock signal is asserted, and driving the output node using the signal from the storage node when the clock signal is de-asserted.

In view of FIGS. 6B, 10B and 10C, FIG. 11B illustrates yet another representation of an output noise insensitive latch 1000B that is equivalent to output noise insensitive latch 1100A. In this embodiment, the functionality of primary latch element 1110 and strong enabled tri-state keeper 1140 are represented as multiplexer 1150. In this embodiment, multiplexer 1150 is an inverting multiplexer with the clock signal on data clock line CLK functioning as the select signal In FIG. 11B, input node IN is connected to a first input terminal of multiplexer 1150. Not storage node QTN is connected to a second input terminal of multiplexer 1150. An output terminal of multiplexer 1150 is connected to output terminal QBAR. Data clock line CLK is connected to a select terminal of multiplexer 1150.

The operation of output noise insensitive latch 1100B is fully equivalent to the other latches of this invention. Hence, the functionality and features of latch 1100A are incorporated herein by reference.

In one embodiment, a latch 1200, which can be any one of or any combination of embodiments of the output noise insensitive latches described above, can be included in various-parts of a computer system 1210, which has a hardware configuration like a stand alone personal computer or workstation. However, in another embodiment, computer system 1210 is part of a client-server computer system 1200.

For either a client-server computer system or a standalone computer system, memory 1212 typically includes both volatile memory, such as main memory, and non-volatile memory, such as hard disk drives. In still another embodiment, computer system 1210 is contained in a single package.

In this example, processor 1211 includes a circuit that in turn includes latch 1200A. A support circuit 1213 also includes a circuit that in turn includes latch 1200B, and I/O interface 1214 includes a circuit that in turn includes latch 1200C. While it is not illustrated, display unit 1216, keyboard 1212, and mouse 1218 also could each include one or more embodiments of latch 1200.

Figure 12:
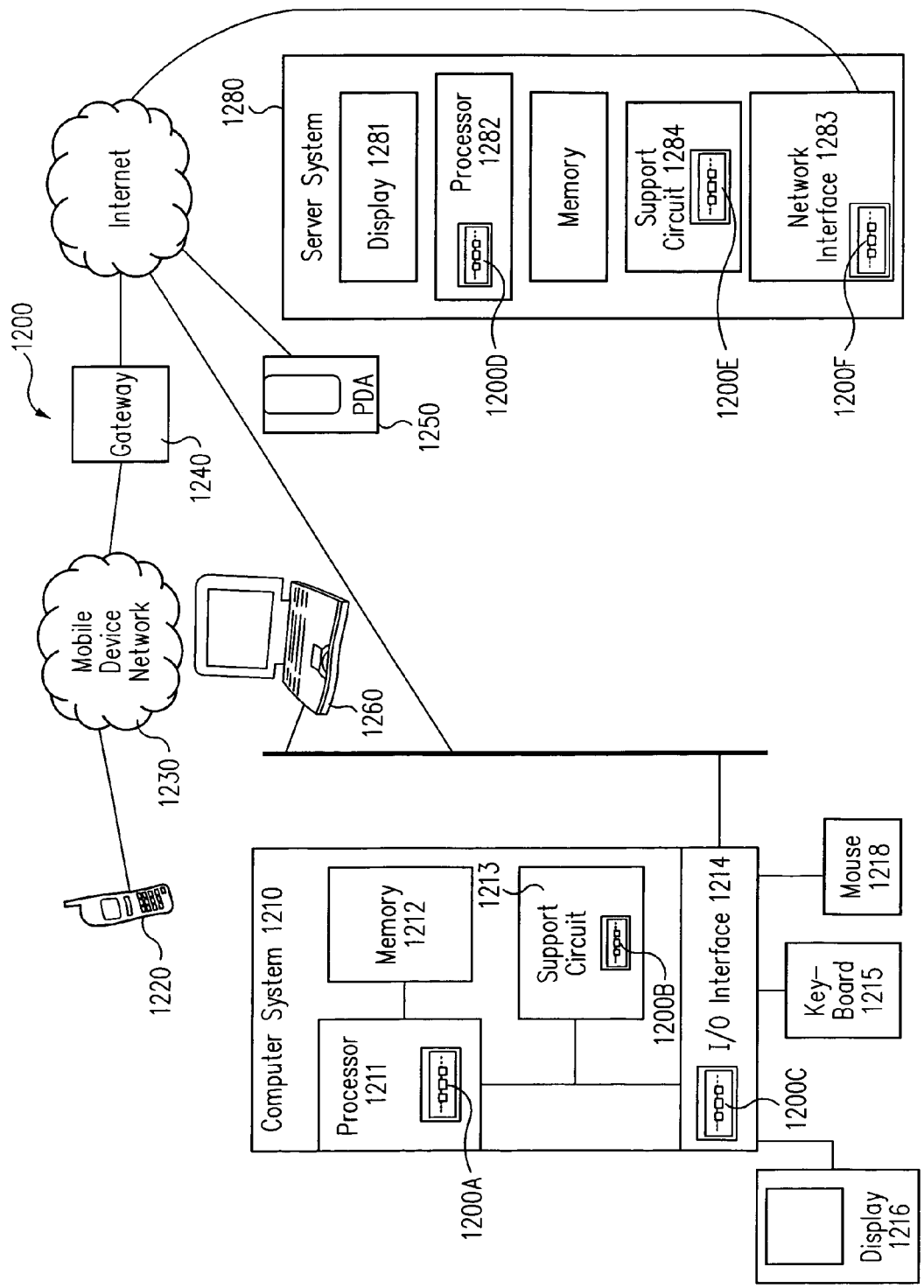
FIG. 12 is an illustration of a system that includes various circuits that each in turn includes an embodiment or embodiments of one or more embodiments of the output noise insensitive latch according to the principles of this invention.

While in FIG. 12, computer system 1210 is illustrated as a single unit, computer system 1210 can be comprised of multiple different computers, wireless devices, server computers, or any desired combination of these devices that are interconnected. In view of this disclosure, an embodiment of latch 1200 can be implemented in a wide variety of computer system configurations where latch 1200 can be any one or any combination of the latches described above.

For example, an embodiment of latch 1200 can be included in any one of, all, or any combination of cellular telephone 1220, mobile device network 1230, gateway 1240, portable computer 1260, personal digital assistant 1250 or any other device that utilizes latches. In FIG. 12, server system 1280 includes a processor 1282 that in turn includes latch 1200D, a support circuit that includes a latch 1200E, and a network interface that includes a latch 1200F.

This disclosure provides exemplary embodiments of the present invention. The scope of the present invention is not limited by these exemplary embodiments. Numerous variations, whether explicitly provided for by the specification or implied by the specification, may be implemented by one of skill in the art in view of this disclosure.

I claim:

1. A structure comprising:
   a dynamic data input terminal;
   a storage node;
   a not storage node;
   an output terminal;
   a data clock line;
   a staticizer connected to the input terminal, the output terminal, and the data clock line;
   a mirror staticizer connected to the input terminal in parallel with the staticizer, to the storage node, and to the data clock line;
   a weak keeper having an input terminal connected to the storage node and an output terminal connected to the not storage node; and
   a strong enabled tri-state keeper connected to the not storage node, to the data clock line, and to the output terminal, wherein the strong enabled tri-state keeper comprises:
   a transistor of a first type comprising:
     a first lead couplable to and de-couplable from a first power supply voltage;
     a second lead connected to the output terminal; and
     a third lead connected to the data clock line;
   a transistor of second type comprising a first lead connected to the output terminal;
     a second lead couplable to and de-couplable from a second power supply voltage; and
     a third lead connected to the not storage node;
   another transistor of the first type comprising a first lead connected to the first power supply voltage;
     a second lead connected to the first lead of the transistor of the first lead; and
   a third lead connected to the not storage node;
   wherein the another transistor is shared with the weak keeper.

2. The structure of claim 1 wherein the weak keeper is connected to the data clock line.

3. The structure of claim 1 wherein the weak keeper comprises a weak feedback inverter keeper.

4. The structure of claim 1 wherein the structure in included in a semi-dynamic flip-flop.

5. A structure comprising:
   a dynamic data input terminal;
   a storage node;
   a not storage node;
   an output terminal;
   a data clock line;
   a staticizer connected to the input terminal, the output terminal, and the data clock line;
   a mirror staticizer connected to the input terminal in parallel with the staticizer, to the storage node, and to the data clock line;
   a weak keeper having an input terminal connected to the storage node and an output terminal connected to the not storage node; and
   a strong enabled tri-state keeper connected to the not storage node, to the data clock line, and to the output terminal, wherein the staticizer further comprises:
   a transistor of a first type comprising:
     a first lead connected to a first power supply voltage;
     a second lead connected to the output terminal; and
     a third lead connected to the dynamic data input terminal.

6. The structure of claim 5 wherein the staticizer further comprises:
   a transistor of a second type comprising:
     a first lead connected to the output terminal;
     a second lead couplable to and de-couplable from a second power supply voltage; and
     a third lead connected to the data clock line.

7. The structure of claim 6 wherein the staticizer further comprises;
   another transistor of the second type comprising:
     a first lead connected to the second power supply voltage;
     a second lead connected to the second lead of the transistor of the second type; and
     a third lead connected to the dynamic data input terminal.

8. The structure of claim 7 wherein the another transistor is shared with the mirror staticizer.

* * * * *